United States Patent
Wang

(10) Patent No.: US 9,823,960 B2
(45) Date of Patent: Nov. 21, 2017

(54) APPARATUS AND METHOD FOR PARALLEL CRC UNITS FOR VARIABLY-SIZED DATA FRAMES

(71) Applicant: CAVIUM, INC., San Jose, CA (US)

(72) Inventor: Weihuang Wang, Los Gatos, CA (US)

(73) Assignee: CAVIUM, INC., San Jose, CA (US)

( * ) Notice: Subject to any disclaimer, the term of this patent is extended or adjusted under 35 U.S.C. 154(b) by 34 days.

(21) Appl. No.: 14/850,873

(22) Filed: Sep. 10, 2015

(65) Prior Publication Data

US 2017/0075754 A1  Mar. 16, 2017

(51) Int. Cl.
*H03M 13/11* (2006.01)
*G06F 11/10* (2006.01)
*H03M 13/09* (2006.01)

(52) U.S. Cl.
CPC ......... *G06F 11/1004* (2013.01); *H03M 13/09* (2013.01)

(58) Field of Classification Search
CPC .................................................... H03M 13/11
USPC ................................. 714/781, 758, 807, 821
See application file for complete search history.

(56) References Cited

U.S. PATENT DOCUMENTS

| 9,069,694 B2* | 6/2015 | Lee ..................... G06F 11/1004 |
| 2005/0005224 A1* | 1/2005 | Ridgeway ......... H03M 13/6516 |
| | | 714/758 |
| 2010/0241936 A1* | 9/2010 | Hirth ................... H03M 13/091 |
| | | 714/807 |
| 2012/0173952 A1* | 7/2012 | Kumar ................ H03M 13/091 |
| | | 714/758 |

OTHER PUBLICATIONS

Grymel et al., "A Novel Programmable Parallel CRC Circuit," *IEEE Transactions on Very Large Scale Integration (VLSI) Systems*, Circuit 2011, 5 pages.

* cited by examiner

*Primary Examiner* — Fritz Alphonse
(74) *Attorney, Agent, or Firm* — Duane Morris LLP; David T. Xue

(57) ABSTRACT

A cyclic redundancy check (CRC) device configured to support parallel calculation of a CRC value for a data frame comprises a plurality of CRC processing units each configured to accept one of a plurality of data segments of the data frame of a variable size that can be unknown to the CRC device beforehand and generate one of plurality of partial CRC values in parallel with rest of the CRC processing units over multiple clock cycles/iterations. The CRC device further comprises an integration component configured to integrate the plurality of partial CRC values from the plurality of CRC processing units into one final CRC value for the data frame, wherein the final CRC value is attached to the data frame for error checking during storage or transmission of the data frame.

26 Claims, 3 Drawing Sheets

APPARATUS AND METHOD FOR PARALLEL CRC UNITS FOR VARIABLY-SIZED DATA FRAMES

TECHNICAL FIELD

The present application relates to cyclic redundancy checksum (CRC). More particularly, the present invention relates to parallel executable CRC units for variably-sized data frames.

BACKGROUND

A cyclic redundancy check (CRC) is a short fixed-length datum (checksum) error-detecting code for an arbitrary data packet/frame commonly used in digital networks and storage devices for data frame protection and transmission to detect accidental changes to raw data. Each data frame entering these systems gets a short CRC value calculated and attached to it, based on the remainder of a polynomial division of its contents. The CRC value is then attached to and accompanies the data frame during its transmission and/or storage. On retrieval, the calculation of the CRC is repeated, and corrective action can be taken against presumed corruption of the data frame or the received CRC itself if the CRC values do not match.

CRCs are so called because the check (data verification) value is a redundancy (i.e., it expands the data frame without adding information) and the calculation is based on cyclic codes. CRCs are popular because they are simple to implement in binary hardware, easy to analyze mathematically, and particularly good at detecting common errors caused by noise in transmission channels. Because the check value has a fixed length, the CRC can also be used for a hash index and database lookup.

In the context of high-speed network devices and switches, each frame or packet of data can be divided and processed in multiple physical planes of the devices in parallel, wherein each physical plane may have its associated design logic circuitry used to calculate its CRC value. Since the CRC value is calculated on a per-frame/packet basis, the values from the physical planes need to be combined together as one CRC value for the entire data frame. As data throughput of the network devices is getting higher, hardware devices are increasing internal parallel data width for processing, i.e., the level of parallelism is increasing. It is thus desirable to have the CRC values of the data frames calculated efficiently irrespective of the level of parallelism.

The foregoing examples of the related art and limitations related therewith are intended to be illustrative and not exclusive. Other limitations of the related art will become apparent upon a reading of the specification and a study of the drawings.

SUMMARY

A cyclic redundancy check (CRC) device configured to support parallel calculation of a CRC value for a data frame comprises a plurality of CRC processing units each configured to accept one of a plurality of data segments of the data frame of a variable size that can be unknown to the CRC device beforehand and generate one of plurality of partial CRC values in parallel with rest of the CRC processing units over multiple clock cycles/iterations. The CRC device further comprises an integration component configured to integrate the plurality of partial CRC values from the plurality of CRC processing units into one final CRC value for the data frame, wherein the final CRC value is attached to the data frame for error checking during storage or transmission of the data frame

BRIEF DESCRIPTION OF THE DRAWINGS

The foregoing will be apparent from the following more particular description of example embodiments of the invention, as illustrated in the accompanying drawings in which like reference characters refer to the same parts throughout the different views.

DETAILED DESCRIPTION

Figure 1:
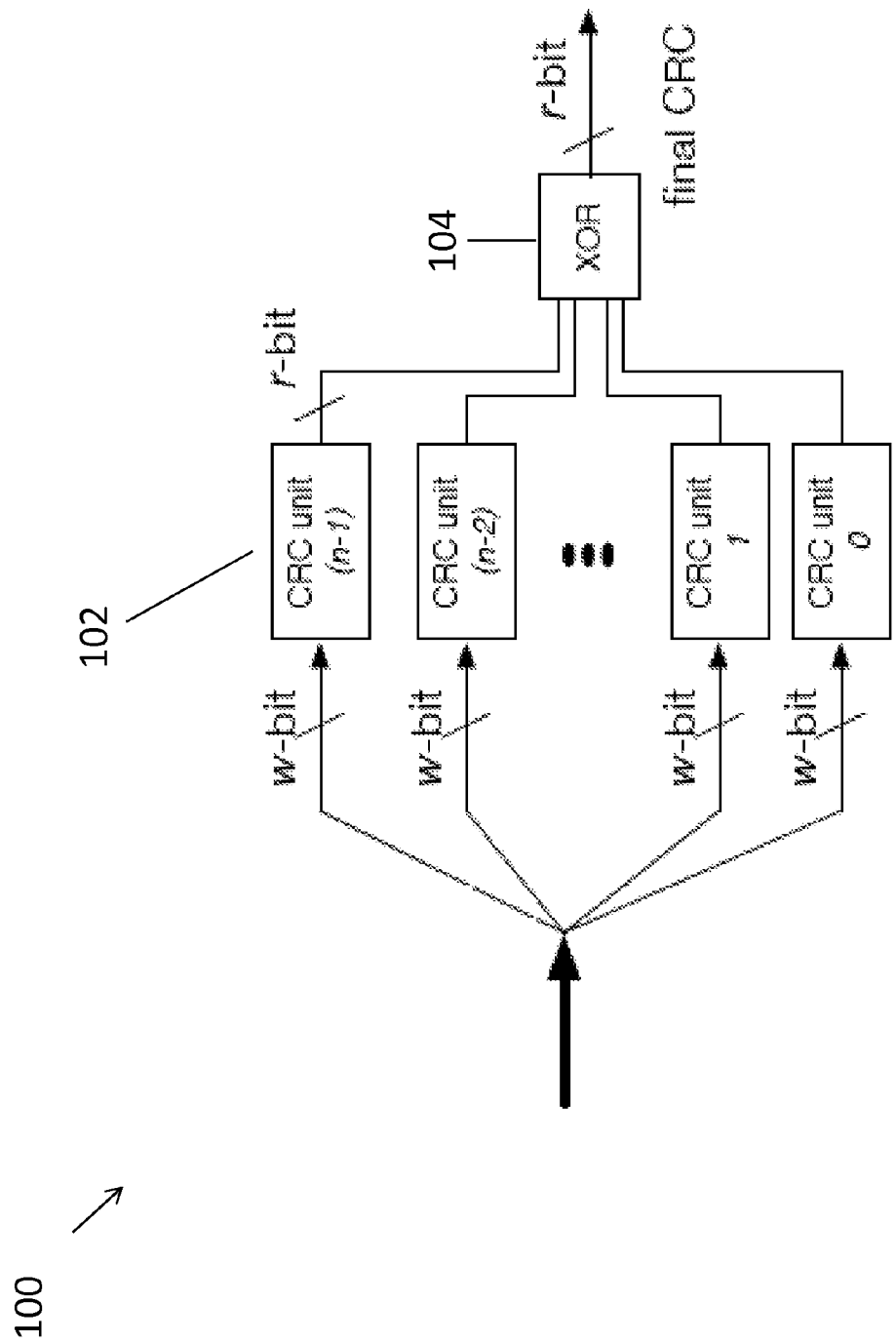
FIG. 1 illustrates an example of a top-level block diagram of a hardware CRC device configured to support parallel calculation of CRC value for a variable-sized data frame. in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates an example of a top-level block diagram of a hardware CRC device 100 configured to support parallel calculation of CRC value for a variably-sized data frame. Although the diagrams depict components as functionally separate, such depiction is merely for illustrative purposes. It will be apparent that the components portrayed in this figure can be arbitrarily combined or divided into separate software, firmware and/or hardware components. Furthermore, it will also be apparent that such components, regardless of how they are combined or divided, can execute on the same host or multiple hosts, and wherein the multiple hosts can be connected by one or more networks.

In the example of FIG. 1, the CRC device 100 includes a plurality of (n) CRC processing units 102 each configured to generate a (partial) CRC value for a data segment from an incoming data frame in parallel. Each of the CRC processing units 102 is configured to accept a data vector w-bit in size as its input and generate a (partial) CRC value/state vector r-bit in size as its output. The CRC device 100 further includes an integration component 104 configured to integrate the CRC values from the plurality of CRC processing units 102 into a final CRC value for the data frame.

In some embodiments, each individual CRC processing unit 102 is configured to calculate its partial CRC value/state based on a r-degree polynomial P(x) with coefficients $(p_{r-1}, \ldots, p_0)$, $P(x)=x^r+p_{r-1}x^{r-1}+ \ldots +p_0$. In some embodiments, each of the CRC processing units 102 is implemented as a discrete time-invariant linear system, where the output from the system is definitive once the input stream to the CRC processing unit is set/available. The partial state from each CRC processing unit 102 is integrated through XOR 104 to generate a final CRC value. For each iteration, the state $C_{j+1}$ at the next clock cycle j+1 in the CRC processing unit 102 is a function of the current state $C_j$ plus new input from the data frame to the individual CRC processing unit 102 and can be expressed as $$C_{j+1} = F^w(C_j + D_j) \quad (1)$$

where "+" represents an XOR operation, $C_j$ is the state of the CRC processing unit 102 after j-th iteration (clock cycle) of processing, $D_j$ is input data vector of size w, $F^w$ is a transformation matrix for the individual CRC processing unit, and w is the number of bits in the data segment that can be processed by the CRC processing unit per one clock cycle as discussed below. When the size of the input data segment is larger than or equal to degree of polynomial, i.e. w≥r, input data vector $D_j=[d_{w,j}, d_{w-1,j}, \ldots, d_{0,j}]^T$ and the state vector can be padded to size w with zero $C_j=[c_{r-1}, c_{r-2}, \ldots, c_0, 0, \ldots, 0]^T$.

In some embodiments, the transformation matrix $F^w$ utilized by the CRC processing unit 102 is a r×w matrix calculated recursively from the polynomial P(x), wherein the rightmost column is the coefficient $(p_{r-1}, \ldots, p_0)$ of the polynomial P(x) and the remaining columns can be derived recursively from right to left (i.e., from rightmost column 0 to leftmost column w−1) as follows:

$$F^w = \begin{bmatrix} f_{r-1,w-1} & \cdots & f_{r-1,1} & p_{r-1} \\ \vdots & \ddots & \vdots & \vdots \\ f_{0,w-1} & \cdots & f_{0,1} & p_0 \end{bmatrix} \quad (2)$$

$$f_{a,b} = p_w \cdot f_{r-1,b-1} + f_{a-1,b-1}, \text{ for } a \in [0 \ldots r-1], b \in [1, w-1] \quad (3)$$

When the size of the input data segment is less than degree of polynomial, i.e. w<r, input data vector is padded to size r with zero, $D_j=[d_{w,j}, d_{w-1,j}, \ldots, d_{0,j}, 0 \ldots, 0]^T$ and state vector $C_j=[c_{r-1}, C_{r-2}, \ldots, c_0]^T$.
Transformation matrix $F^w$ is a r×r matrix:

$$F^w = \begin{bmatrix} f_{r-1,w-1} & \cdots & f_{r-1,1} & p_{r-1} & 1 & 0 & \cdots & 0 \\ f_{r-2,w-1} & \cdots & f_{r-2,1} & p_{r-2} & 0 & 1 & \cdots & 0 \\ \vdots & \ddots & \vdots & \vdots & & & \ddots & \\ f_{w,w-1} & \cdots & f_{w,1} & p_w & 0 & 0 & \cdots & 1 \\ f_{w-1,w-1} & \cdots & f_{w-1,1} & p_{w-1} & 0 & 0 & \cdots & 0 \\ \vdots & \ddots & \vdots & \vdots & & & \ddots & \\ f_{0,w-1} & \cdots & f_{0,1} & p_0 & 0 & 0 & \cdots & 0 \end{bmatrix} \quad (4)$$

Figure 2:
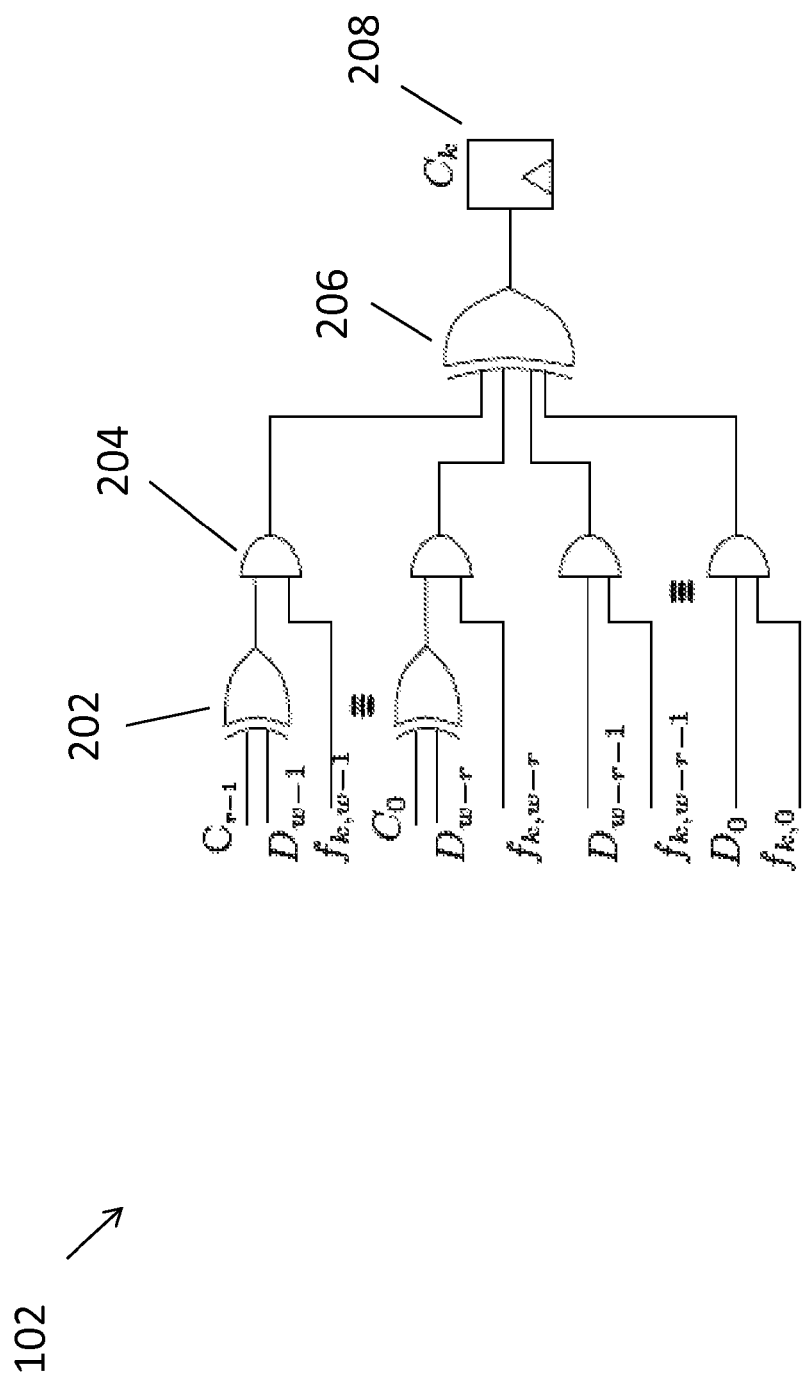
FIG. 2 depicts an example of hardware implementation of a CRC processing unit in accordance with some embodiments.

FIG. 2 depicts an example of hardware implementation of the individual CRC processing unit 102 based on the equations discussed above with w≥r for bit $C_k$, k∈{0..r−1}, where 202s and 206s are XOR gates, 204s are AND gates, and 208 is a storage device configured to keep the partial state from each CRC processing unit 102, wherein the storage device 208 can be but is not limited to a flip-flop, a latch, or a memory. In some embodiments, the CRC processing unit 102 is programmable or re-programmable with different polynomial P(x) by introducing an AND gate 204 with a controlling storage device 208 for each signal that may be a potential input to an XOR gate 202 as illustrated in FIG. 2.

In the example of FIG. 1, the CRC device 100 is configured to break the data frame of variable size into a plurality of smaller data segments/vectors based on number of the CRC processing units 102 and the size of the input data to each of the CRC processing units 102 so that the data frame can be processed by the plurality of CRC processing units 102 in parallel over multiple clock cycles/iterations. Here, the size M of the data frame is unknown to the CRC device beforehand until the end of the data frame is reached and the exact size of the data frame can be determined. The data frame size M is then provided to the CRC processing units 102 before the final iteration (or at the $1^{st}$ iteration if there is only one iteration in total). As such, the data frame size M is not bounded to fit to the size w of the data vectors input to or the size r of the CRC vector output from each of the CRC processing units 102. Specifically, size M of the data frame can be expressed as:

$$m \cdot n \cdot w + q \cdot w + v, \text{ where } q < n \text{ and } v < w$$

For a non-limiting example, the data frame can be of size M=936 bits, which is to be processed by n=4 CRC processing units 102, each having input size w=64 bits and output size r=32 bits, in (m+1)=4 clock cycles, where q=2 and v=40 bits.

In some embodiments, the CRC device 100 is configured to generate the final CRC value for the data frame of variable size M in m+1 clock cycles by utilizing 1) all n CRC processing units 102 each of input data size w to process m·n·w bits in m clock cycles, 2) a subset q of the CRC processing units 102 of input data size w to process q·w bits, and 3) one additional CRC processing unit 102 to process v bits of data in the very last data word of the data frame in one more clock cycle. Specifically, For the first m−1 clock cycles/iterations, the plurality of (n) CRC processing units 102 are configured to process m·n·w bits portion of the M bits data frame serially with each of the n CRC processing units 102 processes w bits of data in parallel with other processing units within each clock cycle based on $F^{nw}$, which is a transformation matrix for the n CRC processing units 102 working in parallel. Here, $F^{nw}$ is logically deducted (e.g., column extended) from the transformation matrix $F^w$ for each individual CRC processing unit as shown in Equation 2 and Equation 3 above:

$$F^{nw} = \begin{bmatrix} f_{r-1,nw-1} & \cdots & f_{r-1,(n-1)w} \\ \vdots & \ddots & \vdots \\ f_{0,nw-1} & \cdots & f_{0,(n-1)w} \end{bmatrix} \quad (5)$$

The partial CRC/transition state output $X_{i,j}$ from each of the CRC processing units 102 for i∈{0 . . . n−1} and j∈{1 . . . m−1} can then be calculated as:

$$X_{n-1,j} = F^{nw}(X_{n-1,j-1} + D_{n-1,j-1}) \quad (6)$$
$$\vdots$$
$$X_{0,j} = F^{nw}(X_{0,j-1} + D_{0,j-1})$$

Note that $X_{i,0}=0$ for i∈{0 . . . n−2}, and $X_{n-1,0}$=seed, i.e. only the first CRC processing unit (e.g., CRC unit 0 in FIG. 1) is loaded with seed before the first iteration, wherein the seed value initializes the first CRC processing unit to a value other than zero to prevent an all-zero data word from resulting in all-zero check sequence.

For the second to the last clock cycle/iteration, i.e. j=m, the first q of the n CRC processing units 102 are configured to process q·w bits portion of the M bits data frame and transit their partial states $X_{n-1,j}$ through $X_{n-q,j}$ the same as above, while the remaining n−q CRC processing units 102 are configured to adjust their partial state transitions $X_{n-q-1,j}$ through $X_{0,j}$ with less than n·w bits of data expected forward:

$$X_{n-1,j} = F^{nw}(X_{n-1,j-1} + D_{n-1,j-1}) \quad (7)$$

$$\vdots$$

$$X_{n-q-1,j} = F^{nw}(X_{pn-q-1,j-1} + D_{n-1,j-1})$$

$$X_{n-q-2,j} = F^{(n-1)w+v}(X_{n-q-2,j-1} + D_{n-q-2,j-1})$$

$$\vdots$$

$$X_{0,j} = F^{(q+1)w+v}(X_{0,j-1} + D_{0,j-1})$$

For the last clock cycle/iteration j=m+1, only the first q of the n CRC processing units 102 shall advance their partial states with less than n·w bits of data expected forward with one more CRC processing unit 102 handling the last v bits portion of the M bits data frame:

$$X_{n-1,j} = F^{qw+v}(X_{n-1,j-1} + D_{n-1,j-1}) \quad (8)$$

$$\vdots$$

$$X_{n-q,j} = F^{w+v}(X_{n-q,j-1} + D_{n-q,j-1})$$

$$X_{n-q-1,j} = F^{v}(X_{n-q-1,j-1} + D_{n-q-1,j-1})$$

Note that if v>=r, its transformation matrix $F^v$ takes the form of:

$$F^v = \begin{bmatrix} f_{r-1,v-1} & \cdots & f_{r-1,1} & p_{r-1} \\ \vdots & \ddots & \vdots & \vdots \\ f_{0,v-1} & \cdots & f_{0,1} & p_0 \end{bmatrix} \quad (9)$$

otherwise the transformation matrix $F^v$ takes the form of:

$$F^v = \begin{bmatrix} f_{r-1,v-1} & \cdots & f_{r-1,1} & p_{r-1} & 1 & 0 & \cdots & 0 \\ f_{r-2,v-1} & \cdots & f_{r-2,1} & p_{r-2} & 0 & 1 & \cdots & 0 \\ \vdots & \ddots & \vdots & \vdots & & & \ddots & \\ f_{v,v-1} & \cdots & f_{v,1} & p_v & 0 & 0 & \cdots & 1 \\ f_{v-1,v-1} & \cdots & f_{v-1,1} & p_{v-1} & 0 & 0 & \cdots & 0 \\ \vdots & \ddots & \vdots & \vdots & & & \ddots & \\ f_{0,v-1} & \cdots & f_{0,1} & p_0 & 0 & 0 & \cdots & 0 \end{bmatrix} \quad (10)$$

where the input data vector is padded to size r with zero, $$D_j = [d_{v,j}, d_{v-1,j}, \ldots, d_{0,j}, 0, \ldots, 0]^T \quad (11)$$

During the partial CRC value generation process, the plurality of CRC processing units 102 in the CRC device 100 are configured to operate independently from each other in parallel with no communication or interaction between them. Such isolation among the plurality of CRC processing units 102 enables each data segment of the data frame to be processed independently from other segments during the multiple clock cycles/iterations. Additionally, such isolation provides architectural as well as implementation flexibility of the CRC device 100.

Once the partial CRC values/states are calculated by the CRC processing units 102, they are integrated together to generate one final CRC value/state for the data frame by the integration component 104 of the CRC device 100, wherein the integration component 104 is configured to perform bit-wise XOR operations on the CRC values/states as follows:

$$CRC = X_{n-1,m+1} + \ldots + X_{n-q-1,m+1} + X_{n-q-2,m} + \ldots + X_{0,m} \quad (12)$$

By breaking a variably-sized data frame into smaller data segments and process them by the plurality of isolated CRC processing units 102 in parallel before combing the partial results from the CRC processing units 102 into a final CRC value for the data frame, the CRC device 100 is capable of handling a data frame of large variable size unknown to the CRC device 100 beforehand at high speed and thus meets the increasingly high throughput of the network and/or storage devices that require CRC checking.

Figure 3:
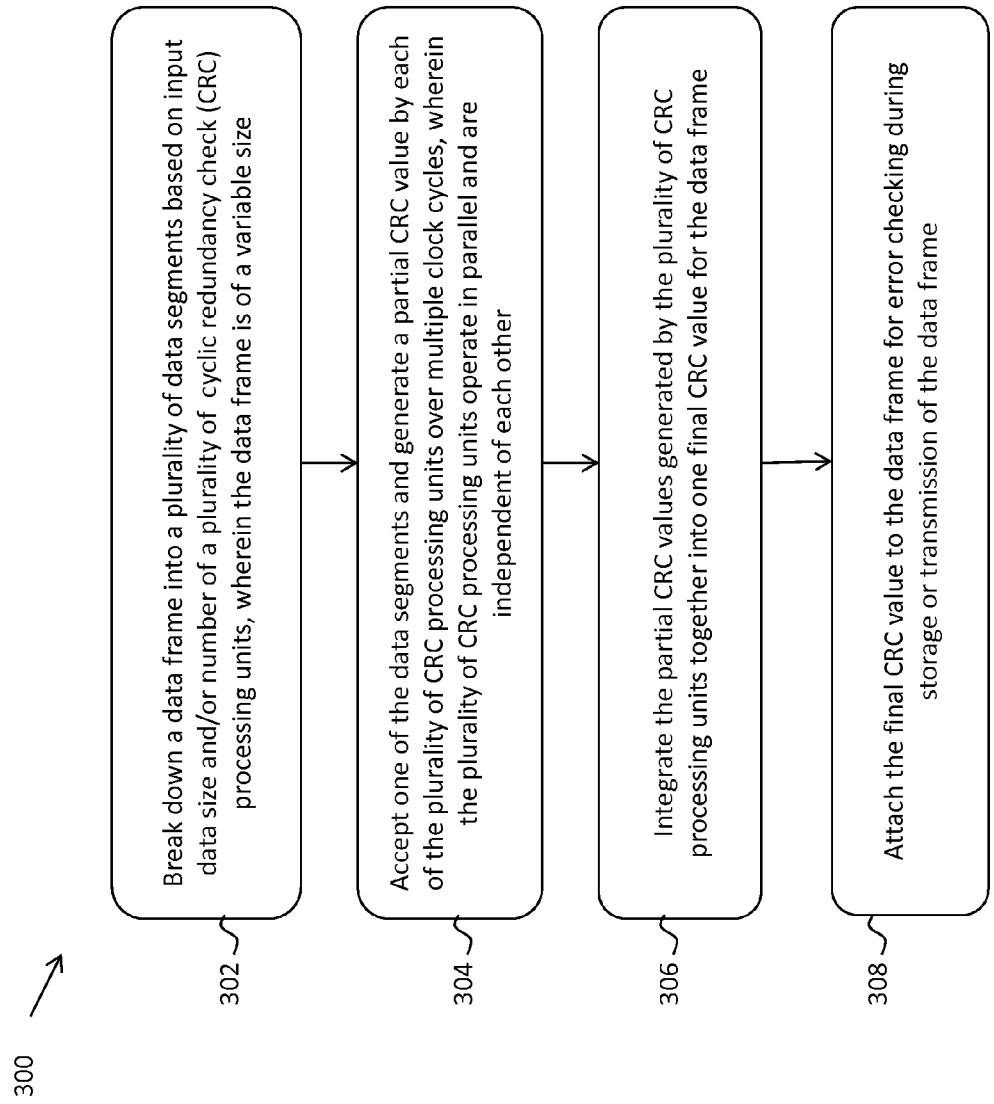
FIG. 3 depicts a flowchart of an example of a process to support parallel calculation of CRC value of a variably-sized data frame in accordance with some embodiments.

FIG. 3 depicts a flowchart of an example of a process to support parallel calculation of CRC value of a variably-sized data frame. Although the figure depicts functional steps in a particular order for purposes of illustration, the processes are not limited to any particular order or arrangement of steps. One skilled in the relevant art will appreciate that the various steps portrayed in this figure could be omitted, rearranged, combined and/or adapted in various ways.

In the example of FIG. 3, the flowchart 300 starts at block 302, where a data frame is broken down into a plurality of data segments based on input data size and/or number of a plurality of cyclic redundancy check (CRC) processing units, wherein the data frame can be of a variable size. The flowchart 300 continues to block 304, where the plurality of CRC processing units each accepts one of the data segments and generates a partial CRC value in parallel and independent of each other over multiple clock cycles. The flowchart 300 continues to block 306, where the partial CRC values generated by the plurality of CRC processing units in parallel are integrated together into one final CRC value for the data frame. The flowchart 300 ends at block 308, where the final CRC value is attached to the data frame for error checking during storage or transmission of the data frame.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. A cyclic redundancy check (CRC) device configured to support parallel calculation of a CRC value for a data frame, comprising:

a plurality of CRC processing units each configured to
        accept one of a plurality of data segments of the data frame of a variable size unknown to the CRC device beforehand;

generate one of a plurality of partial CRC values in parallel with rest of the CRC processing units over multiple clock cycles or iterations;

an integration component configured to integrate the plurality of partial CRC values from the plurality of CRC processing units into one final CRC value for the data frame, wherein the final CRC value is attached to the data frame for error checking during storage or transmission of the data frame, wherein the data frame is broken down into the plurality of data segments based on number of (n) the CRC processing units and size (w) of input data to each of the CRC processing units.

2. The CRC device of claim 1, wherein:
size of the data frame is not bounded to fit to the size of the input data to or the size of the CRC value generated by each of the CRC processing units.

3. The CRC device of claim 1, wherein:
each of the CRC processing units is implemented as a discrete time-invariant linear system configured to calculate the CRC value over the multiple clock cycles/iterations, wherein output is definitive once the input to the CRC processing unit is set.

4. The CRC device of claim 1, wherein:
each of the CRC processing units is configured to calculate its partial CRC value based on a r-degree polynomial.

5. The CRC device of claim 4, wherein:
each of the CRC processing units is configured to calculate its partial CRC value using a transformation matrix created recursively from the polynomial.

6. The CRC device of claim 4, wherein:
each of the CRC processing units is programmable or re-programmable with different polynomial.

7. The CRC device of claim 1, wherein:
all (n) of the CRC processing units each of input data size w are configured to process m·n·w bits of the data frame in parallel in m clock cycles.

8. The CRC device of claim 7, wherein:
a subset q of the n CRC processing units of input data size w are configured to process q·w bits of the data frame in parallel in one additional clock cycle.

9. The CRC device of claim 8, wherein:
one additional CRC processing unit is configured to process remaining bits of data in the data frame in the last clock cycle.

10. The CRC device of claim 1, wherein:
the plurality of CRC processing units are configured to operate independently from each other in parallel with no communication or interaction between them while generating their partial CRC values over the multiple iterations.

11. The CRC device of claim 1, wherein:
each data segment of the data frame is processed independently from other segments during the multiple clock cycles.

12. The CRC device of claim 1, wherein:
the integration component is configured to perform XOR operations on the partial CRC values to generate the final CRC value.

13. A method to support parallel calculation of a CRC value for a data frame, comprising:
accepting each of a plurality of data segments of the data frame of a variable size unknown beforehand and generating a partial CRC value by each of a plurality of CRC processing units over multiple clock cycles or iterations, wherein the plurality of CRC processing units operate in parallel and are independent of each other;

integrating the partial CRC values generated by the plurality of CRC processing units together into one final CRC value for the data frame;

attaching the final CRC value to the data frame for error checking during storage or transmission of the data frame, wherein the data frame is broken down into the plurality of data segments based on number of (n) the CRC processing units and size (w) of input data to each of the CRC processing units.

14. The method of claim 13, wherein:
size of the data frame is not bounded to fit to the size of the input data to or the size of the CRC value generated by each of the CRC processing units.

15. The method of claim 13, further comprising:
implementing each of the CRC processing units as a discrete time-invariant linear system configured to calculate the CRC value over the multiple clock cycles/iterations, wherein output is definitive once the input to the CRC processing unit is set.

16. The method of claim 13, further comprising:
calculating the partial CRC value based on a r-degree polynomial.

17. The method of claim 16, further comprising:
calculating the partial CRC value using a transformation matrix calculated recursively from the polynomial.

18. The method of claim 16, wherein:
each of the CRC processing units is programmable or re-programmable with different polynomial.

19. The method of claim 13, further comprising:
processing m·n·w bits of the data frame in parallel via all (n) of the CRC processing units each of input data size w in m clock cycles.

20. The method of claim 19, further comprising:
processing q·w bits of the data frame in parallel via a subset q of the n CRC processing units of input data size w in one additional clock cycle.

21. The method of claim 20, further comprising:
processing remaining bits of data in the data frame via one additional CRC processing unit in the last clock cycle.

22. The method of claim 13, wherein:
the plurality of CRC processing units operate independently from each other in parallel with no communication or interaction between them.

23. The method of claim 13, further comprising:
processing each data segment of the data frame independently from other segments during the multiple clock cycles.

24. The method of claim 13, further comprising:
performing XOR operations on the partial CRC values to generate the final CRC value.

25. A cyclic redundancy check (CRC) device configured to support parallel calculation of a CRC value for a data frame, comprising:
a plurality of CRC processing units each configured to accept one of a plurality of data segments of the data frame of a variable size unknown to the CRC device beforehand;

generate one of plurality of partial CRC values in parallel with rest of the CRC processing units over multiple clock cycles/iterations;

an integration component configured to integrate the plurality of partial CRC values from the plurality of CRC processing units into one final CRC value for the data frame, wherein the final CRC value is attached to the data frame for error checking during storage or transmission of the data frame, wherein each of the CRC processing units is implemented as a discrete time-invariant linear system configured to calculate the CRC value over the multiple clock cycles/iterations, wherein output is definitive once input to the CRC processing unit is set.

26. A method to support parallel calculation of a CRC value for a data frame, comprising:

accepting each of a plurality of data segments of the data frame of a variable size unknown beforehand and generating a partial CRC value by each of a plurality of CRC processing units over multiple clock cycles or iterations, wherein the plurality of CRC processing units operate in parallel and are independent of each other;

integrating the partial CRC values generated by the plurality of CRC processing units together into one final CRC value for the data frame;

attaching the final CRC value to the data frame for error checking during storage or transmission of the data frame, wherein each of the CRC processing units is implemented as a discrete time-invariant linear system configured to calculate the CRC value over the multiple clock cycles/iterations, wherein output is definitive once input to the CRC processing unit is set.

* * * * *